United States Patent
Gao et al.

(10) Patent No.: US 6,369,453 B1
(45) Date of Patent: Apr. 9, 2002

(54) SEMICONDUCTOR WAFER FOR MEASUREMENT AND RECORDATION OF IMPURITIES IN SEMICONDUCTOR INSULATORS

(75) Inventors: Pei-Yuan Gao; Narendra Patel, both of San Jose; Allen S. Yu, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/637,389

(22) Filed: Aug. 11, 2000

(51) Int. Cl.[7] ............................................... H01L 29/40
(52) U.S. Cl. ...................................... 257/786; 257/618
(58) Field of Search ................................ 257/786, 758, 257/760, 618, 620, 639, 640, 641; 438/195, 231, 476, 624, 637, 978, 982

(56) References Cited

U.S. PATENT DOCUMENTS

| | | | | |
|---|---|---|---|---|
| 4,091,406 A | * | 5/1978 | Lewis | 257/639 |
| 4,091,407 A | * | 5/1978 | Williams et al. | 257/639 |
| 4,982,250 A | | 1/1991 | Manos, II et al. | 357/23.5 |
| 5,296,745 A | * | 3/1994 | Shirai | 257/786 |
| 5,300,461 A | | 4/1994 | Ting | |
| 5,364,818 A | * | 11/1994 | Ouellet | 438/476 |
| 5,742,094 A | | 4/1998 | Ting | 257/620 |
| 5,856,705 A | | 1/1999 | Ting | 257/758 |

* cited by examiner

Primary Examiner—David Nelms
Assistant Examiner—Dung A Le
(74) Attorney, Agent, or Firm—Mikio Ishimaru

(57) ABSTRACT

A method and semiconductor wafer is provided for measurement and recordation of hydrophilic elements in semiconductor insulators by depositing a moisture barrier layer over a previously deposited insulating layer of a semiconductor wafer. The semiconductor wafers become pilot or calibration wafers which may be placed immediately in an infrared radiation instrument to allow measurement of the concentration of hydrophilic elements in the insulating layer or stored for recordation purposes and measured later.

4 Claims, 1 Drawing Sheet

SEMICONDUCTOR WAFER FOR MEASUREMENT AND RECORDATION OF IMPURITIES IN SEMICONDUCTOR INSULATORS

TECHNICAL FIELD

The present invention relates generally to semiconductor manufacturing and more specifically to a method for accurate measurement and recordation of boron and phosphorus caused impurities in semiconductor insulator layers.

BACKGROUND ART

Silicon compounds, such as silicon dioxide ($SiO_2$), that can be used as insulators are particularly valuable on electronic substrates. Such insulators serve as protective coatings, inter-layer dielectric layers, doped dielectric layers to produce transistor-like devices, multilayer devices, etc.

Unfortunately, development of high integration and high-density very large-scale integrated circuits has progressed so rapidly that earlier silicon (Si) compounds have become less than satisfactory. To meet the recent needs of miniaturization of high-density semiconductor devices, a technique of forming a flat insulating layer under low temperature conditions, which utilizes flow on silicate glass, has started to come into use.

Silicate glass is easily flattened and makes a good insulating layer. Thus, silicate glasses such as borophosphotetraethylorthosilicate (BPTEOS) and borophosphosilicate (BPSG) glass have come into use.

Typically, the silicate glass is deposited in a spin-on deposition process in a liquid form in a nitrogen atmosphere. The silicate glass is then subjected to thermal treatment to allow for proper planarization and stress relief. Without the thermal treatment, incorrect concentrations of the boron (B) and phosphorus (P) elements will result in a non-planar surface and stresses, which can lead to de-lamination, and flaking of subsequently deposited layers.

One problem with boron and phosphorous is that they are hydrophilic (attract water) elements and they start to form precipitates immediately after deposition of the silicate glass. These precipitates may cause short-circuiting of the electrical interconnections, which are later formed on the silicate glass.

This has not been a major problem during semiconductor fabrication because the processing, which includes the formation of contacts, interconnects, and vias are performed in a nitrogen atmosphere.

However, during pilot or calibration runs, pilot (dummy) or calibration wafers are run through an insulator deposition machine and then are measured in air under an infrared radiation instrument to obtain the concentrations of both boron and phosphorus prior to going into production operation. Such measurement instruments as the BIO-RAD instrument from Bio-Rad Laboratories, Inc. at 237 Putham Ave. in Cambridge, Mass., are used.

Also, pilot wafers are run after the deposition machine undergoes any type of maintenance. Further, these pilot wafers may be kept for substantial periods of time in order to maintain traceability records of the production runs, which used the pilot wafers, in the event of any problems further down in the production line or out in the field.

It has been found that the insulator on pilot wafers absorbs moisture from the air as an unpredictable function of time and humidity. The absorption of moisture results in false measurements and leads to incorrect determination of the boron and phosphorus concentrations depending on how long after production the pilot wafer is measured.

It has also been noted that the calibration wafers used for the infrared radiation instruments also absorb moisture which means that the calibration standards are sometimes inaccurate and adversely affect subsequent measurements.

In the past, when these problems arose, the wafers were sent to an external laboratory for validation where the precise amount of moisture and concentration of the hydrophilic elements could be analyzed.

Unfortunately, such procedures could not give real-time measurements and were time consuming. Further, sometimes the precipitates were in the original silicate glass deposition rendering the readings inaccurate because a determination could not be made of when the precipitates were formed and thus, the true source of the precipitates. Without knowing the true source of the precipitates, the actual boron and phosphorus concentrations of the silicate glass deposited could not be determined.

As the density of semiconductor devices increases, the problem caused by impurities at lower and lower levels becomes quite substantial and a need to solve the problems related to the element caused impurities become more pressing.

DISCLOSURE OF THE INVENTION

The present invention a pilot or calibration semiconductor wafer having a silicate glass insulator containing a hydrophilic element for measurement or recordation purposes. The semiconductor wafer has a moisture barrier, test transparent material on the silicate glass insulator and can be placed in a moisture containing atmosphere without affecting the concentration of the hydrophilic element. The semiconductor wafer can be stored and measurements taken later to accurately determine the concentration of the hydrophilic element in the silicate glass insulator.

The present invention further provides a method for processing a pilot or calibration semiconductor wafer having a silicate glass insulator containing a hydrophilic element for measurement or recordation purposes. The method includes depositing the silicate glass insulator onto the semiconductor wafer followed by the deposition of a moisture barrier, test transparent material onto the silicate glass insulator in a non-moisture containing environment. The semiconductor wafer can be placed in a moisture containing atmosphere. The measurement can be performed immediately or the semiconductor wafer can be stored and measurements taken later to accurately determine the concentration of the hydrophilic element in the silicate glass insulator.

The present invention further provides a method for processing a pilot or calibration silicon wafer having a BPTEOS or BPSG silicate glass insulator containing hydrophilic elements, such as boron and phosphorus, for measurement or recordation purposes. The method includes depositing the silicate glass insulator onto the silicon wafer followed by the deposition of a moisture barrier, test transparent material, such as an ultra-violet transparent nitride, onto the silicate glass insulator in a nitrogen containing environment. The semiconductor wafer can be placed in air. The measurement can be performed immediately or the semiconductor wafer can be stored without special precautions and measurements taken later to accurately determine the concentration of the boron and phosphorus in the silicate glass insulator.

The above and additional advantages of the present invention will become apparent to those skilled in the art from a

BEST MODE FOR CARRYING OUT THE INVENTION

Figure 1:
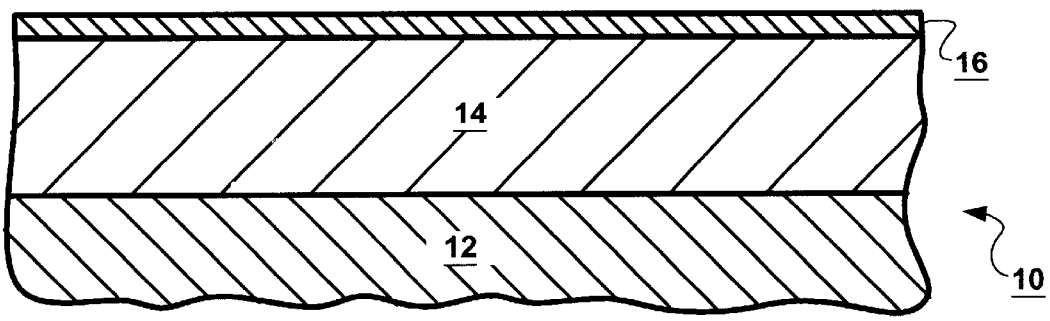
FIG. 1 is a cross-section of a portion of a multilayer semiconductor device according to the present invention.

Referring now to FIG. 1, therein is shown a portion of a semiconductor wafer 10 including a semiconductor substrate 12 and a planarized insulating layer 14. It will be noted, as will subsequently be explained in detail, that the semiconductor wafer 10 is either a pilot semiconductor wafer or a calibration semiconductor wafer and, in either situation, does not have electronic semiconductor devices either in or on it. Deposited on the insulating layer 14 is a moisture barrier layer 16.

The semiconductor substrate 12 is generally of doped or undoped silicon and the insulating layer 14 is of a silicate glass. Silicate glasses are preferred for their ability to be deposited at low temperatures below 400° C. and for their self-leveling properties which make subsequent planarization and deposition of subsequent layers of material easier. Examples of this type of silicate glass are borophosphosilicate glass (BPSG) and borophosphotetraethylorthosilicate (BPTEOS) glass. The two exemplary silicate glasses contain hydrophilic elements boron (B) and phosphorus (P), and other silicate glasses contain either one or the other which absorb moisture and form precipitates which could cause short- circuits in production semiconductor wafers which have semiconductor devices and interconnections embedded in the insulating layer 14.

The moisture barrier layer 16 is selected from the group of materials which are moisture proof and are also transparent to the mechanism of testing. of a protective material commonly used in semiconductor processing, such as silicon nitride (SiN). Based on experimentation, it has been determined that the silicon nitride needs to be between 150 to 350 Angstroms (Å) thick, with the optimum at 250 Å. It has been determined that without the moisture barrier layer 16, the precipitate count begins to increase immediately and continues to increase past 35 days. Conversely, with the moisture barrier layer 16, the change in the precipitate level is negligible past 35 days.

Figure 2:
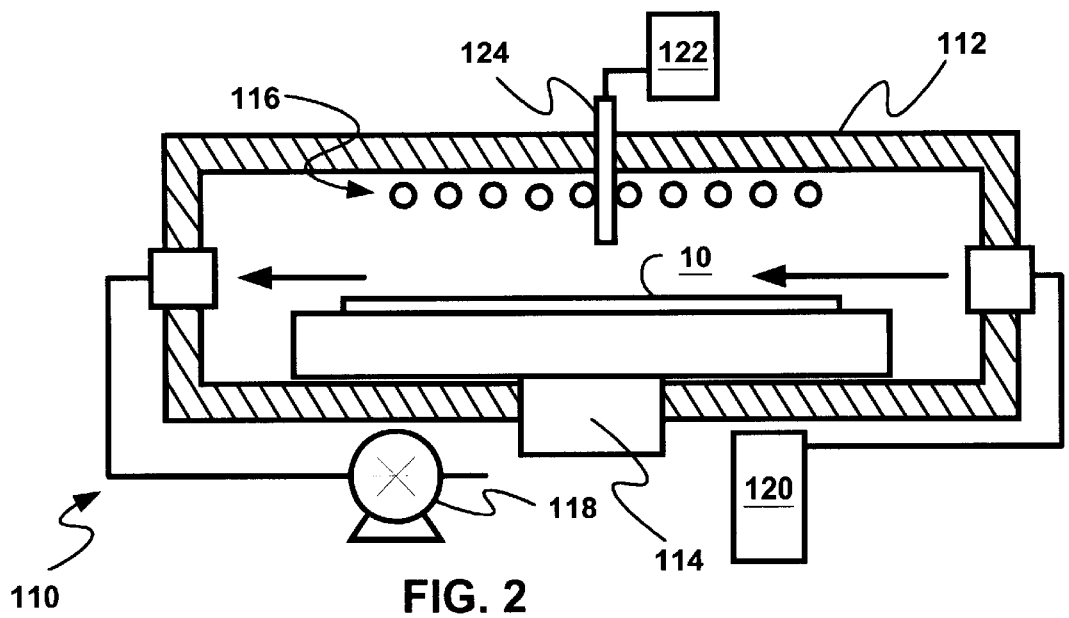
FIG. 2 is the cross-section of the chemical vapor deposition equipment used in the present invention for processing a pilot or calibration semiconductor wafers.

Referring now to FIG. 2, therein is shown chemical vapor deposition equipment 110 consisting of a chamber 112 containing a hot plate carrier 114 for supporting the semiconductor wafer 10. The semiconductor wafer 10 is heated by heat lamps 116 or the hotplate carrier 114 in a nitrogen atmosphere provided by a gas source 120. The gas source 120 is capable of providing a plurality of different gasses. The chemical vapor deposition equipment 110 is provided with a pump 118 for pumping gasses out of the chamber 112 and an insulating material source 122 for providing fluid insulating material to a nozzle 124.

Figure 3:
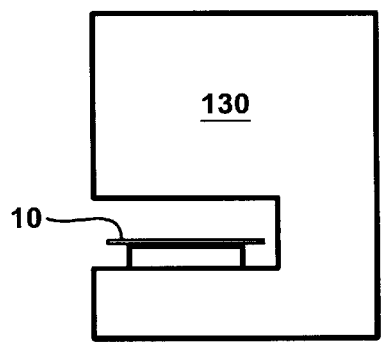
FIG. 3 is a schematic of a semiconductor wafer in an infrared instrument for determining the concentration of hydrophilic elements in the processed semiconductor wafer.

Referring now to FIG. 3, therein is shown the semiconductor wafer 10 in an infrared radiation instrument 130 such as the BIORAD tester by Bio-Rad Laboratories, Inc., 237 Putham Avenue, Cambridge, Mass. 02139. In the infrared radiation instrument 130, the concentration of hydrophilic elements, such as boron and phosphorus, is determined.

In the operation of the present invention, the insulating layer 14 is deposited on the semiconductor wafer 10 in the chemical vapor deposition equipment 110 from the insulating material source 122 through the nozzle 124 in a nitrogen atmosphere provided by the gas source 120. The semiconductor wafer 10 is then subject to thermal heat treatment in the nitrogen atmosphere in the chamber 112 to cause glass-flow planarization of the insulating layer 14 using the heat lamps 116 and/or the hot plate carrier 114.

Subsequently, the chemical vapor deposition equipment 110 can allow the entry of various precursor gasses from the gas source 120 to cause the deposition of a moisture barrier material, such as ultra violet (UV) silicon nitride ($Si_3N_4$) with a Refractance Index (RI)=1.915. UV silicon nitride is an ideal since it is moisture proof and is transparent to infrared radiation in the range used by the BIORAD tester when properly formulated.

It has been discovered that the UV transmittance depends on the percentage of siliconhydrogen bond in the UV silicon nitride that absorbs UV light. The UV transmittance is measured directly and the percentage of the silicon-hydrogen bond controlled by adjusting the temperature of deposition to maintain the UV transmittance at 20% to 30%, which is the transmittance acceptable to the BIORAD tester. In the best mode, the UV silicon nitride is deposited to a thickness under 250 Å for wafers for sub-0.18 micron critical dimension semiconductor devices.

In semiconductor fabrication, the sample semiconductor wafer 10 which is used to test the process is referred to as a "pilot" wafer. It carries no semiconductor devices. Also, a pilot wafer is used as the first wafer through whenever the equipment for depositing the insulating layer 14 undergoes periodic maintenance.

Since the processing for a single batch of wafers can take between 6 to 10 weeks and sometimes a production run will last for an extended period of time before changing any of the process parameters, it is often desirable to store pilot wafers for recordation purposes so that if later problems are detected, the original characteristics of the insulating layer 14 can be re-examined. Thus, it is desirable that the storage may be accomplished without having to have the silicon wafers 10 stored under special conditions in a moisture free atmosphere. The moisture barrier layer 14 provides sufficient protection for the necessary record keeping time.

Further, the silicon wafer 10 with the moisture barrier layer 16 is sufficiently stable that it can be used as a hydrophilic material standard for calibrating the infrared radiation instrument 130. In this situation, one of the silicon wafers 10 is used as a standard and no external laboratory validation is required.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A semiconductor wafer comprising:

an unprocessed semiconductor wafer;

a silicate glass insulator on the unprocessed semiconductor wafer, the silicate glass insulator containing a hydrophilic element; and a moisture barrier material on the silicate glass insulator.

2. The semiconductor wafer as claimed in claim 1, wherein the silicate glass insulator contains a hydrophilic element selected from a group consisting of boron, phosphorus, and a combination thereof.

3. The semiconductor wafer as claimed in claim 1 wherein the moisture barrier material is ultra violet silicon nitride with a Refractance index of 1.915.

4. The semiconductor wafer as claimed in claim 1, wherein the moisture barrier material is silicon nitride with a thickness less than 250 Å.

* * * * *